US007567188B1

(12) United States Patent
Anglin et al.

(10) Patent No.: US 7,567,188 B1
(45) Date of Patent: Jul. 28, 2009

(54) POLICY BASED TIERED DATA DEDUPLICATION STRATEGY

(75) Inventors: Matthew J. Anglin, Tucson, AZ (US); David M. Cannon, Tucson, AZ (US); Colin S. Dawson, Tucson, AZ (US); Howard N. Martin, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/100,695

(22) Filed: Apr. 10, 2008

(51) Int. Cl.
*H03M 7/46* (2006.01)

(52) U.S. Cl. ........................................ 341/63; 707/202

(58) Field of Classification Search ............. 341/60–90; 707/3, 6, 7, 101, 202, 204, 104.1
See application file for complete search history.

(56) References Cited

U.S. PATENT DOCUMENTS

| | | | | |
|---|---|---|---|---|
| 5,628,004 | A | 5/1997 | Gormley et al. | |
| 6,934,714 | B2 | 8/2005 | Meinig | |
| 7,092,956 | B2 | 8/2006 | Ruediger | |
| 7,103,602 | B2 | 9/2006 | Black et al. | |
| 7,200,604 | B2 * | 4/2007 | Forman et al. | 707/101 |
| 7,318,162 | B2 * | 1/2008 | Rineer et al. | 713/193 |
| 7,444,358 | B2 * | 10/2008 | Paczkowski et al. | 707/104.1 |
| 7,457,934 | B2 * | 11/2008 | Yagawa | 711/170 |
| 7,472,113 | B1 * | 12/2008 | Watson et al. | 707/3 |
| 2003/0097359 | A1 | 5/2003 | Ruediger | |
| 2005/0097150 | A1 | 5/2005 | McKeon et al. | |

* cited by examiner

*Primary Examiner*—Lam T Mai
(74) *Attorney, Agent, or Firm*—Oppenheimer Wolff & Donnelly LLP

(57) ABSTRACT

The present invention provides for a method, system, and computer program for the application of data deduplication according to a policy-based strategy of tiered data. The method operates by defining a plurality of data storage policies for data in a deduplication system, policies which may be arranged in tiers. Data objects are classified according to a selected data storage policy and are split into data chunks. If the selected data storage policy for the data object does not allow deduplication, the data chunks are stored in a deduplication pool. If the selected data storage policy for the data object allows deduplication, deduplication is performed. The data storage policy may specify a maximum number of references to data chunks, facilitating storage of new copies of the data chunks when the maximum number of references is met.

25 Claims, 5 Drawing Sheets

| Tier | GOLD (301) | SILVER (302) | BRONZE (303) |
|---|---|---|---|
| Recovery Objective | High | Medium | Low |
| Recovery Time Objective | 30 Minutes | 60 Minutes | 120 Minutes |
| Potential Data Loss | 1 Gold File; 1 or more Silver, Bronze Files | 1 or more Silver Files; 1 or more Bronze Files | 1 or more Bronze Files |
| | | | |

FIG. 3A

| Data | GOLD TIER DATA (311) | SILVER TIER DATA (312) | BRONZE TIER DATA (313) |
|---|---|---|---|
| Deduplication | No Deduplication | Deduplication Performed | Deduplication Performed |
| Maximum Data Chunk References | 10 Silver; Unlimited Bronze | 10 Silver; Unlimited Bronze | Unlimited Bronze |
| | | | |
| | | | |

FIG. 3B

POLICY BASED TIERED DATA DEDUPLICATION STRATEGY

FIELD OF THE INVENTION

The present invention generally relates to data storage and retrieval operations within a data storage system. The present invention specifically relates to the operation of a method and a system of implementing a policy-based tiered data deduplication strategy to optimize performance of the storage and retrieval of deduplicated data.

BACKGROUND OF THE INVENTION

Data storage solutions can be enhanced by introducing a form of compression known as "deduplication". Deduplication generally refers to the elimination of redundant subfiles from data objects, these subfiles generally referred to as blocks, chunks, or extents. The deduplication process is usually applied to a large collection of files in a shared data store, and its successful operation greatly reduces the redundant storage of common data.

In a typical configuration, a disk-based storage system such as a storage-management server or virtual tape library has the capability to perform deduplication by detecting redundant data chunks within its data objects and preventing the redundant storage of such chunks. For example, the deduplicating storage system could divide file A into chunks a-h, detect that chunks b and e are redundant, and store the redundant chunks only once. The redundancy could occur within file A or with other files stored in the storage system. Deduplication can be performed as objects are ingested by the storage manager (in-band) or after ingestion (out-of-band).

Typically, when performing deduplication, the object is divided into chunks using a method such as Rabin fingerprinting. Redundant chunks are detected using a hash function such as MD5 or SHA-1 to produce a hash value for each chunk, and this hash value is compared against values for chunks already stored on the system. The hash values for stored chunks are typically maintained in an index. If a redundant chunk is identified, that chunk can be replaced with a pointer to the matching chunk.

Advantages of data deduplication include requiring reduced storage capacity for a given amount of data; providing the ability to store significantly more data on a given amount of disk; and improving the ability to meet the required recovery time objective when restoring from disk rather than tape.

With the advent of data deduplication technologies, new challenges have arisen for data protection and management applications. Although data deduplication can make it possible to store more data on disk to improve restore performance as compared to tape, deduplication can result in degraded performance as compared to accessing non-deduplicated data from disk. Deduplication of data may result in a sub-optimal data restore scenario because data now has to be read back as chunks and those chunks may be dispersed across many different volumes within a given deduplication system. This dispersal of data caused by data deduplication could impact restore performance for data, and compromise the ability of a data protection product to meet the required recovery objectives.

Data deduplication technologies also put data at risk. Particularly, as deduplication algorithms and processes assign references to a given chunk of data because it is the same (based on a hash value) and cause data to be deduplicated, this increases the "single point of failure" risk to all files that reference that data chunk. For example, if deduplication causes 100 files to reference the same single instance of a chunk of data, if that data chunk is lost (such as from media failure, corruption, etc.), then 100 files are impacted by this loss. Without data deduplication, of those 100 actual files, only those specifically impacted by the media failure would be lost, and if the loss only affected something as small as one block on disk, the data loss may have only affected a single file of those 100.

Currently there are no known solutions to these issues as the state of the art does not currently allow for tuning or policies that allow for the benefits of space reduction achieved by data deduplication. What is needed is tuning and policies combined with the ability to optimize restore performance to meet recovery time objectives, and to mitigate the "single point of failure" risk inherent in storage products that use deduplication technologies. Additionally, the ability is needed to realize the benefits of data deduplication for general data, while also optimizing restore performance and minimizing risk for the most critical data.

BRIEF SUMMARY OF THE INVENTION

The present invention introduces service levels for deduplicated data, allowing optimal recovery and minimal risk for designated data objects, while also achieving deduplication benefits for general data. This invention utilizes policies in conjunction with a tiered data deduplication strategy in a storage management application in order to balance the significant space reduction benefits of data deduplication against the need for optimal recovery for the most critical data. Similarly, these policies are also used to manage the risk to files if a given data chunk is compromised through media failure or other corruption rendering it unusable.

The combination of policies and tiering for data storage in a deduplication enabled storage system solves many problems inherent with deduplication technologies. Notably, the requirement to have designated data objects stored for optimal restore is achieved by allowing data not to be deduplicated and the data chunks dispersed.

Additionally, the present invention provides a means to allow deduplication while allowing for the mitigation of risk associated with the loss of a data chunk. The policies allow this to affect only a single file or a smaller number of files than if deduplication was done for all possible files using the same data chunk. The present invention also provides a means to leverage the data chunks of high importance data without compromising the ability of the file that references that data to meet its recovery objectives.

One embodiment of the present invention operates by defining a tiered set of data storage policies to a deduplication pool. Each data storage policy tier contains settings to apply to data within the tier, including a maximum reference count for data chunks referenced by deduplicated data chunks within the tier. Each data object within the deduplication pool is classified within the data storage policy tier, and thus each data chunk of the data object is also classified according to the data storage policy tier when the data object is deduplicated and divided into data chunks.

Each data chunk contains not only a data storage policy classification, but also identification information. This identification information includes the number of references to the data chunk from every data storage policy. The number of references to data chunks can be tracked to facilitate data storage policies which limit the number of references to a data chunk.

The data storage policy is applied to the data object's chunks and deduplication is performed, if allowed. If the selected data storage policy does not permit deduplication of the data object, then each chunk of the data object is stored within the deduplication pool.

If the data storage policy the data object belongs to permits deduplication, then each chunk is deduplicated. If an identical copy of the chunk does not yet exist in the deduplication pool, then the chunk will be stored in the deduplication pool.

If an identical copy of the chunk exists within the deduplication pool, then the reference count of the previously stored identical copy is checked. If the reference count of the previously stored identical copy is less than the data storage policy maximum reference count, then a pointer is created to this identical copy data chunk, and the reference count is incremented.

If the reference count of the previously stored identical copy is equal to or exceeds the maximum reference count for the data storage policy, then the data chunk is stored within the deduplication pool, thus creating another copy of the data chunk in the deduplication pool. The reference count for the data chunk is then set to 1.

In one embodiment of the present invention, three tiers of data storage policies are present. The first tier does not allow data deduplication of any data objects; the second tier allows deduplication of data objects but contains a policy limit for the number of references to a data chunk; and the third tier allows deduplication and contains no policy limit for the number of references to data chunks.

BRIEF DESCRIPTION OF THE DRAWINGS

FIG. 3A illustrates a drawing representative of exemplary tiers of data storage policies in accordance with one embodiment of the present invention;

FIG. 3B illustrates a drawing representative of exemplary tiers of data storage policies in accordance with one embodiment of the present invention;

DETAILED DESCRIPTION OF THE INVENTION

Figure 1:
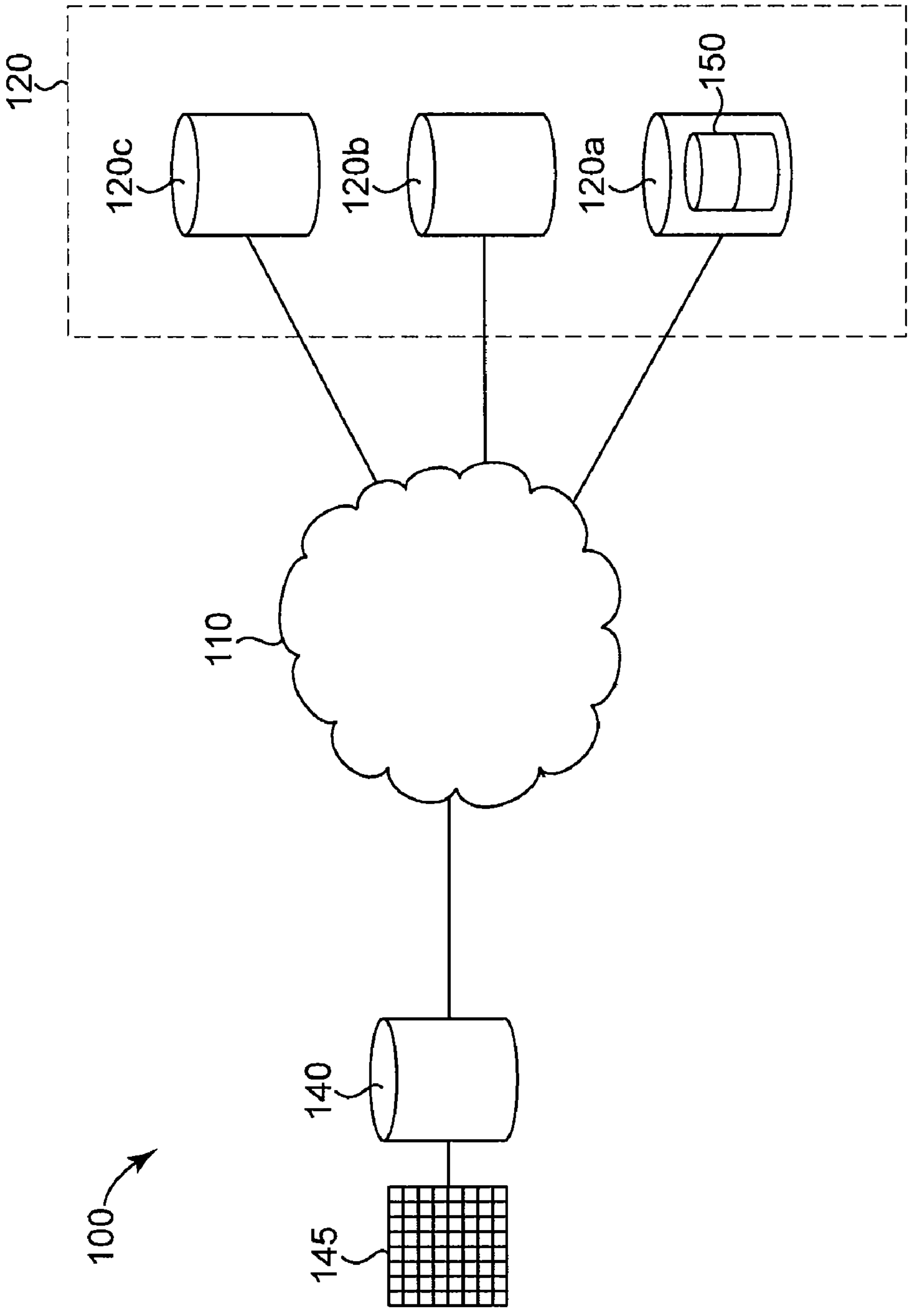
FIG. 1 illustrates an exemplary operational environment for the operation of one embodiment of the present invention.

The presently disclosed invention introduces service levels for deduplicated data in a storage management application. The application of service levels allows optimal recovery and minimal risk for designated data objects, while also achieving deduplication benefits for general data storage.

One embodiment of the present invention utilizes policies in conjunction with a tiered data deduplication strategy in order to balance the significant space reduction benefits of data deduplication against the need for optimal recovery for the most critical data. Similarly, these policies are also used to manage the risk to files if a given data chunk is compromised through media failure or other corruption rendering it unusable.

This combination of policies and tiering for data storage in a deduplication-enabled storage system solves many problems inherent with deduplication technologies. Most notably, it provides a means to have designated data objects stored for optimal restore which is achieved by allowing data not to be deduplicated and the data chunks dispersed.

Another aspect of the presently disclosed invention provides a means to allow deduplication while allowing for the mitigation of risk associated with the loss of a data chunk. The policies allow this to affect only a single file or a smaller number of files than if deduplication was done for all possible files using the same data chunk.

Another aspect of the presently disclosed invention provides a means to leverage the data chunks of high importance data without compromising the ability of the file that references this data to meet a recovery objective. Thus, deduplication activity can be managed based on an analysis of the recovery time objectives and tolerance for risk.

To implement a policy-based tiered strategy according to the present invention, the policies that govern data deduplication must be considered and defined. Namely, when data is stored in a storage management product, it is not all created equally. There are many different classes of data that are most often distinguished by their importance to an organization. That importance may often be manifest by the recovery objectives dictated for that data.

For example, the data which is critical to the operation of a business may require a recovery objective to be fully restored and back in production in 30 minutes or less, such as financial data which must be quickly restored to an unaltered state. Other types of data may have a lesser recovery objective, such as needing to be fully restored and available to users in 120 minutes or less.

In one embodiment, the present invention is implemented within a deduplication storage system that stores data, where the storage system may elect to deduplicate some portion of the stored data to improve the efficiency of the system. The deduplication storage system may be implemented as a collection of files where the deduplication is performed to eliminate redundant data stored across those files. The deduplication storage system may be further implemented as a volume or group of volumes. The system may simply be a mount point or a LUN (logical unit number) where the device type is abstracted or virtualized by some other means. The term "deduplication pool" refers generally to a storage target used by the storage management system such that data stored in the deduplication pool is a candidate for deduplication. The deduplication pool can comprise one or more storage volumes, an entire storage management system, or even span multiple storage management systems.

FIG. 1 depicts a block diagram of an exemplary operational environment for deduplication of data according to one embodiment of the present invention, demonstrating a storage management system 100 operating over a network 110. The storage management system 100 includes a deduplication pool 120 where data is stored during its normal operation within the storage management system, the deduplication pool 120 including multiple storage disks 120*a*, 120*b*, and 120*c* connected over the network 110. The primary storage disk 120*a* contains a volume 150 which stores a plurality of data objects.

The storage management system 100 further includes a database 140 that contains an index 145 which tracks the location of data objects stored throughout the storage management system. This index 145 tracks data stored in volumes throughout the deduplication pool 120.

Figure 2:
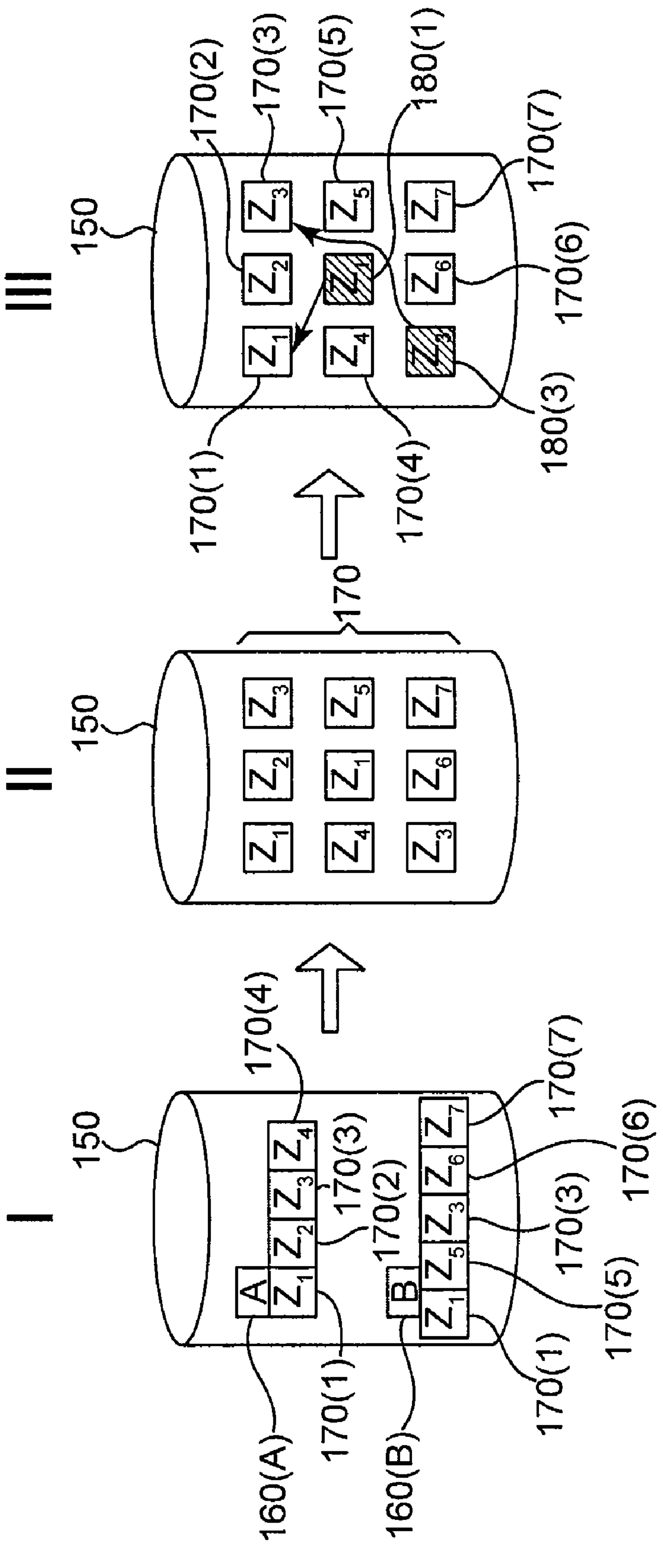
FIG. 2 illustrates an exemplary deduplication process being performed in accordance with one embodiment of the present invention.

An exemplary process of the deduplication of data according to one embodiment of the present invention is depicted in FIG. 2. As depicted in Stage I, data has been ingested into the system before performing deduplication, i.e., data objects are stored in the storage management system in an original, unmodified state before deduplicating. This is depicted by volume 150 in Stage I which contains data objects 160(A) and 160(B) that have not yet been deduplicated.

The deduplication process as depicted in Stage I of FIG. 2 operates by splitting each data object 160(A)-(B) stored on volume 150 into sets of various chunks 170. As further shown in Stage I, data object 160(A) is divided into chunks 170(1), 170(2), 170(3), and 170(4), and data object 160(B) is divided into chunks 170(1), 170(5), 170(3), 170(6), and 170(7). As shown, it is possible for multiple data objects to contain identical chunks, as chunks 170(1) and 170(3) are present in both data objects 160(A) and 160(B).

The result of splitting the data objects is depicted in Stage II of FIG. 2, with the set of data chunks 170 now residing on the data volume 150. Alternatively, the deduplication process may involve storing and/or deduplicating the data chunks 170 onto another volume in the storage management system, or deduplicating the data chunks as the data objects are being ingested into the storage management system.

After the deduplication process is complete, each of the data objects 160(A)-(B) which existed on the primary storage volume 150 will be transformed into a series of chunks and pointers. As depicted in Stage III of FIG. 2, the deduplication process has operated to replace data chunks that are duplicate of 170(1) and 170(3) with pointers 180(1) and 180(3). Once the data is fully deduplicated, the primary storage media volume 150 contains only one copy of each data chunk within data chunks 170. The index 145 depicted within FIG. 1 of the exemplary storage management system is utilized to list and track the various data chunks 170 and pointers 180, allowing the system to efficiently locate duplicate chunks and deallocate space to eliminate the redundant chunks.

The deduplication process shown in FIG. 2 is depicted as being performed subsequent to data ingestion. The deduplication process may be initiated via an asynchronous operation to specifically perform data deduplication, or may be initiated in parallel with other server operations such as storage pool backup, data movement between storage pools using data migration, etc. However, the deduplication process may also be performed synchronously during ingestion of new data objects into the storage management system.

One embodiment of the present invention relates to the implementation of a tiered, policy-driven strategy applied to the deduplication activities depicted in FIGS. 1 and 2. In a storage management system which implements data deduplication, the deduplication process may be implemented at a deduplication pool level, such that all the data stored in the deduplication pool would be a candidate for deduplication. Thus, any data stored in the pool would be normally chunked, hashed, and possibly deduplicated using known methods.

To support the policy-driven management of data, a data policy scheme is first defined in order to place the data within classifications. In one embodiment of the invention, this classification scheme is configured into three tiers, in which data objects or files are assigned to the tiers on a file-by-file basis based on the class and the recovery objectives of the data. Such a three-tiered system is depicted in FIG. 3A, and may be implemented as the following:

GOLD Policy 301: High recovery objective. Contains the most critical data for the enterprise requiring recovery in N or less. (For example, this data may need to be recovered in 30 minutes or less). Loss of a chunk of data only affects a single file at the GOLD tier, but possibly more files at lower tiers.

SILVER Policy 302: Intermediate recovery objective. Contains important data for the enterprise requiring recovery in NN or less. (For example, this data may need to be recovered in 60 minutes or less). Loss of a chunk of data only affects limited number of files at the Silver tier, but possibly more files at lower tiers.

BRONZE Policy 303: Low recovery objective. Contains general data for the enterprise, requiring recovery in NNN or less. (For example, this data may need to be recovered in 120 minutes or less). Loss of a chunk of data may affect many different files.

This data classification scheme, for illustration purposes, contains three distinct levels. The present invention, however, may be implemented through the use of two tiers, such as a high recovery objective and a low recovery objective; or through four or more tiers containing numerous intermediate levels.

Deduplication tiers corresponding to the classes of data policies are defined within a given storage system that is enabled for deduplication. Referring back to the three-tiered data storage policies defined above, the deduplication tiers within the deduplication pool would be GOLD, SILVER, and BRONZE.

An exemplary implementation of the actual characteristics of the tiers of data as they relate to the performance of deduplication is depicted in FIG. 3B, and would be implemented as follows:

GOLD Tier Data 311. Does not allow deduplication. No references exist from GOLD tiered data to GOLD tiered data chunks belonging to other data objects. The GOLD tier does not impose a limit on the number of references which can be created from lower-tiered data to GOLD tiered data chunks imposed by the GOLD tier, although the maximum number of references is limited as specified by the policy of other tiers. This is because data classified at the GOLD level is not allowed to be deduplicated, although deduplicated data from lower tiers can reference GOLD tiered data chunks. Specifically, GOLD tiered data is stored contiguously on media such that it is maintained for optimal restore performance. The advantage to having GOLD tiered data in the deduplication pool is that other data with lower priority may use the contiguous chunks that comprise this file for deduplication. Additionally, one file assigned to the GOLD tier does not suffer data loss if another file stored as GOLD sustains a media failure.

SILVER Tier Data 312. Allows data deduplication. The number of references to deduplicated SILVER data is limited based on a predefined policy, meaning that only a predefined number of SILVER data references can exist to data chunks associated with SILVER level data. Thus, data classified at the SILVER level has a limit to the number of other SILVER data references that can depend upon this chunk. For example, if the SILVER policy indicates that only 10 references are allowed for a given data chunk, then once 10 references are reached, a new parent will be established for future additional references to that chunk. This limits or mitigates the number of files affected if a given parent chunk is lost due to a media failure or other damaging action. Note: the number of references from SILVER data chunks to other data chunks is limited based on SILVER policy, regardless of whether the referenced chunks are themselves classified as GOLD or SILVER.

BRONZE Tier Data 313. Allows data deduplication. There is no limit to the number of references to deduplicated BRONZE tier data. BRONZE level data is allowed to be deduplicated to the fullest extent possible. This "all possible" approach to deduplication maximizes the space savings achieved but does so with the understanding that restore performance may not be optimal. Similarly, a loss of a chunk of BRONZE tier data will cause all files that depend upon that chunk to be affected.

These data storage policies may be implemented by administrators, according to requirements based on the characteristics of the data itself. For example, financial data or data with regulatory requirements may require high accuracy and high availability, and thus is a good candidate for the highest tier (depicted as the GOLD tier 301 in FIG. 3A). Because the present invention allows policies to be assigned to files in a deduplication pool on a file-by-file basis, the advantages of deduplication can be applied to numerous files on the pool, while preserving the most critical data in its original state and limiting the effects of deduplication data loss.

Figure 4:
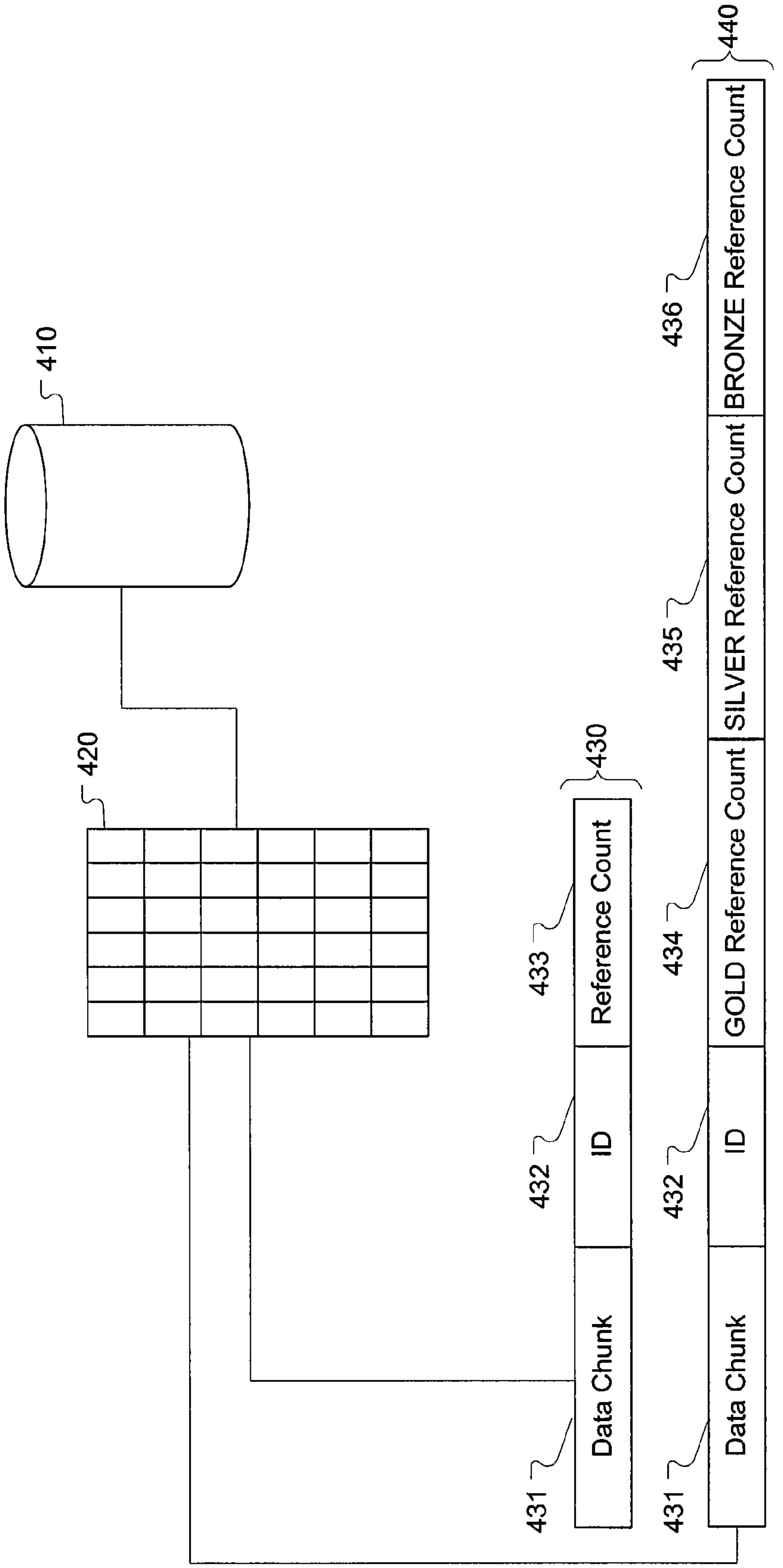
FIG. 4 illustrates a drawing representative of information stored for the exemplary tiers of data storage policies in accordance with one embodiment of the present invention.

In order to manage the data storage policies and the deduplication tiers within a deduplication pool, information needs to be tracked for each data chunk. As depicted for index entry 430 in FIG. 4, an exemplary deduplication storage system or application may track an identifier 432, such as a hash value, for each data chunk 431, and store this information within an index 420 existing in a storage management system database 410. A reference count 433 is typically maintained for shared data chunks, so that pruning or cleanup can be performed for data chunks that are no longer referenced.

The additional information needed to support a policy based tier data deduplication system is that a reference count must be tracked for each policy level of data. This additional information is depicted for index entry 440 in FIG. 4. The identifier 432 is stored for each data chunk 432, but specific reference counts exist for the GOLD tier 434, SILVER tier 435, and BRONZE tier 436.

For example, if a data chunk was previously referenced as:

<Data Chunk><ID Info (hash value)><ReferenceCount>

Using the three-tiered GOLD, SILVER, and BRONZE policy scheme illustrated above, it would now be referenced as:

<Data Chunk><ID Info (hash value)><GoldCount><SilverCount><BronzeCount>

While only three policy levels are described above, it is possible to extend the present invention to more or less levels where there is simply a count that corresponds to a given level (policy).

With the multiple data tiers depicted above, reference count data is needed for each data chunk as it relates to a given storage policy. For example, a three-tier model could potentially need 3 reference counts. (For efficiency, however, only 2 are actually needed since data assigned to the GOLD storage policy allows for the chunking of data but not deduplication, so there are no relative reference counts across members of the GOLD policy). One skilled in the art would appreciate that how reference count data is maintained is implementation specific, and therefore can be represented multiple ways within a database. For example, the reference count data may be a single entry for the chunk with three counts in that row—one for each storage policy that can be applied to that data chunk. Alternatively, the reference count data may be implemented as a unique row representing the chunk and the count for a specific policy level.

It is important to note that in the above-described multiple data tier embodiment, data assigned to a lower-priority policy level can reference a data chunk for a file assigned to the same or higher priority policy level. Thus, there is the need to track the number of references to each data chunk from each tier, even if the data is placed in the lowest or highest tier. For example, BRONZE data may be deduplicated to have unlimited numbers of references to BRONZE, SILVER, or GOLD data chunks. SILVER data may be deduplicated to have a policy-limited number of references to SILVER or GOLD data chunks. GOLD data is not deduplicated, and therefore no GOLD chunks reference deduplicated data chunks.

By allowing data assigned to a lower-priority policy level to reference a data chunk for a file assigned to the same or higher priority level, there is the benefit of having more important data in a deduplication pool because that data can now be used by dependent (lower priority) data for references.

Figure 5:
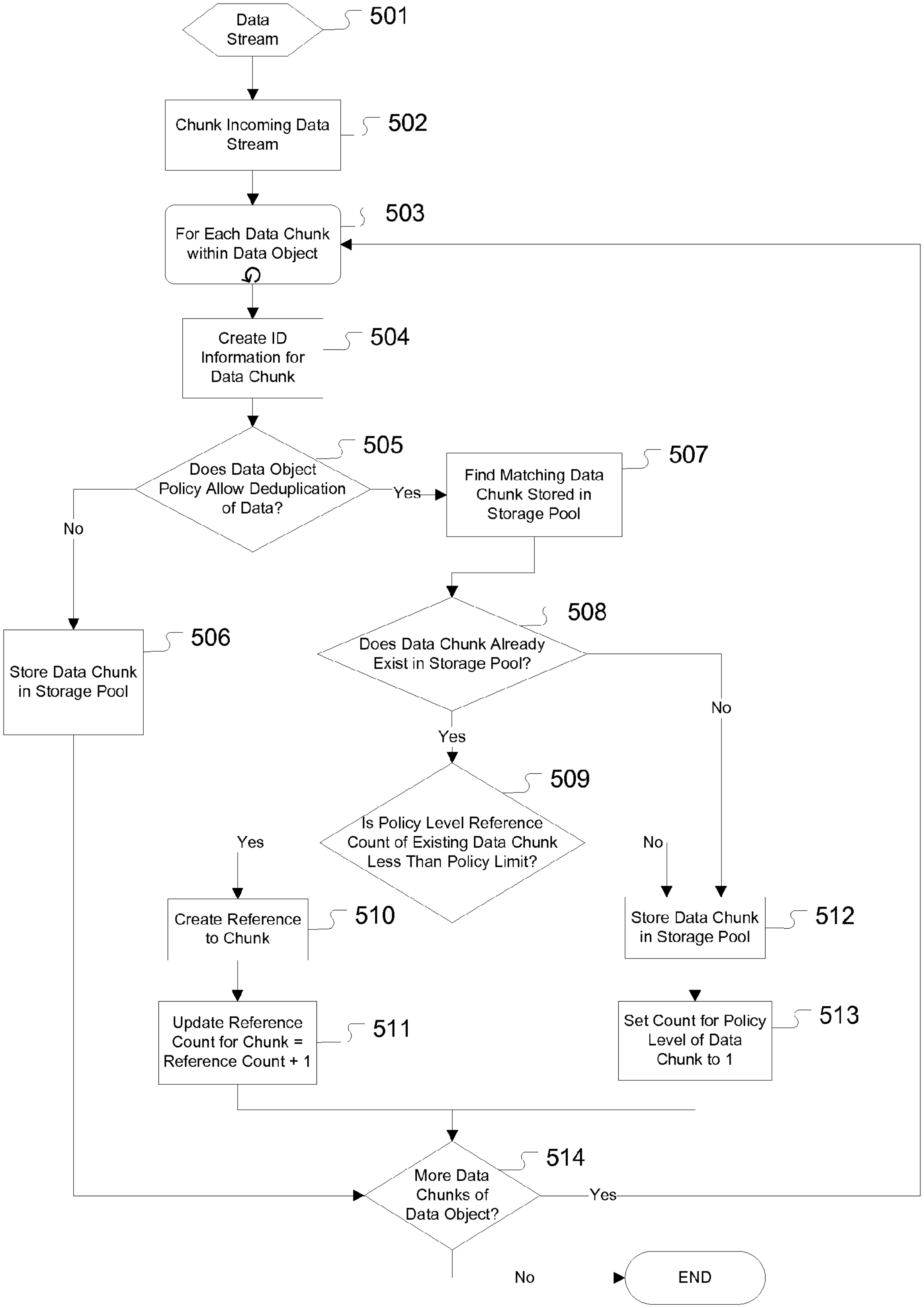
FIG. 5 illustrates a flowchart representative of the operation of a tiered data strategy in accordance with one embodiment of the present invention.

In one embodiment of the present invention, an algorithm is used to decide which data should be deduplicated, and which child references are allowed for a given data chunk. This process of determining the proper deduplication actions is depicted in FIG. 5.

First, the incoming data stream 501 containing data objects is split into chunks as in step 502. Next, the policy is repeated for each data chunk of the data object 503. Identification information is created as in step 504 for each data chunk, such as the hash value which identifies the individual chunk.

The next steps depend upon the policy of the tier that the data is classified into. If the selected policy does not allow deduplication per step 505, then simply store the data chunk as in step 506. Based upon the example listed above, GOLD tier data is not deduplicated, and thus each chunk of GOLD tier data is stored in the deduplication pool even if duplicate copies of the data chunks already exist.

If the selected policy of the data object allows deduplication per step 505, then deduplication processing is undertaken for each data chunk in the data object. The matching data chunks in the deduplication pool are located as in 507, so if an identical data chunk does not exist in the deduplication pool per step 508, the data chunk is stored as in 512. If matching data chunks are located per step 508 and already exist in the deduplication pool, then further deduplication processing continues.

If a duplicate data chunk exists in the deduplication pool, and the reference count of the existing data chunk for the selected policy level is less than the Policy Limit (the Maximum Reference Count) per step 509, then the chunk is referenced as in step 510, and the reference count for the chunk is increased by one for the appropriate data tier as in step 511.

If a duplicate data chunk exists in the deduplication pool, and the reference count of the existing data chunk for the selected policy level is equal to or greater than the policy limit of the data tier per 509, then a new data chunk is stored as in 512, and the reference count for the policy level is set to 1 as in 513. For example, if the SILVER tier maximum reference count is set to 10, and an identical data chunk with 10 SILVER references already exists on the system, then a new copy of SILVER tiered data chunk would be stored, instead of creating 11 references to the data chunk already in the deduplication pool. In contrast, a BRONZE tiered data chunk would still be able to create an unlimited number of references to a SILVER tiered data chunk which already has 10 references.

As depicted, after the deduplication processing is complete for the data chunk, deduplication continues for the remaining data chunks of the data object as in step 514.

The preceding example in FIG. 5 illustrates an in-band data deduplication strategy where the deduplication was performed while the data is being ingested by the storage management application. However, with minimal modification, this operation could also be applied to out-of-band processing where data is ingested and the deduplication is performed later using a background process or task that performed the deduplication and recovered the deduplicated space.

For deduplicated data, the decision to establish a new parent data chunk versus using an existing one is based on the count for that policy level. If the data chunk found was for data at a higher policy level, the data chunk reference decision is still only based on the counts for this policy level. This means if the data chunk was stored for a GOLD file, the decision for a file assigned to SILVER to use this data chunk would be based on only the "SilverCount" associated with this data chunk.

The present invention can take the form of an entirely hardware embodiment, an entirely software embodiment or an embodiment containing both hardware and software elements. In one embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Although various representative embodiments of this invention have been described above with a certain degree of particularity, those skilled in the art could make numerous alterations to the disclosed embodiments without departing from the spirit or scope of the inventive subject matter set forth in the specification and claims.

What is claimed is:

1. A method for applying a deduplication strategy to a data object based on a data storage policy, comprising:

defining a plurality of data storage policies for a deduplication pool, each data storage policy containing settings including a maximum reference count for data chunks;

classifying the data object within a selected data storage policy;

dividing the data object into a plurality of data chunks, each data chunk having reference count data to track a number of references thereto;

storing each data chunk of the data object in the deduplication pool if the selected data storage policy does not allow deduplication of the data object; and performing deduplication on the data object if the selected data storage policy allows deduplication of the data object, including for each data chunk of the data object:

initializing the data chunk reference count data and storing the data chunk in the deduplication pool if a previously stored identical copy of the data chunk does not exist in the deduplication pool, updating the reference count data of and creating a pointer to a previously stored identical copy of the data chunk if the previously stored identical copy of the data chunk exists in the deduplication pool and has a reference count less than the selected data storage policy maximum reference count, and initializing the data chunk reference count data and storing the data chunk in the deduplication pool if each previously stored identical copy of the data chunk existing within the deduplication pool contains a reference count equal to or greater than the selected data storage policy maximum reference count.

2. The method of claim 1, wherein the plurality of data storage policies includes at least three tiered data storage policies, a first data storage policy not allowing data deduplication of data objects, a second data storage policy allowing deduplication of data objects and containing a policy limit for references, and a third data storage policy allowing deduplication of data objects and containing no policy limit for references.

3. The method of claim 1, wherein the plurality of data storage policies includes a data storage policy that does not allow deduplication of data objects.

4. The method of claim 1, wherein the plurality of data storage policies includes a data storage policy that allows deduplication of data objects and contains a defined policy limit for references to data chunks.

5. The method of claim 1, wherein the plurality of data storage policies includes a data storage policy that allows deduplication of data objects and contains no policy limit for references to data chunks.

6. The method of claim 1, wherein the plurality of data storage policies is arranged in tiers, and data chunks classified according to a data storage policy are permitted to create references to data chunks within the same data storage policy or a higher tiered data storage policy and are not permitted to create references to data chunks within a lower tiered data storage policy.

7. The method of claim 1, wherein the step of performing deduplication on the data object occurs synchronously during ingestion of the data object into the deduplication pool.

8. The method of claim 1, wherein the step of performing deduplication on the data object occurs asynchronously during an operation subsequent to ingestion of the data object into the deduplication pool.

9. The method of claim 1, wherein the reference count data includes a plurality of reference counts for tracking the number of references to the data chunk from data chunks classified according to each of the plurality of data storage policies.

10. A method for applying a deduplication strategy to a data object based on a data storage policy, comprising:

defining a first data storage policy for a deduplication pool;

classifying a first data object within the first data storage policy;

dividing the first data object into a plurality of data chunks, each data chunk having reference count data to track a number of references by storage policy thereto;

storing each data chunk of the first data object in the deduplication pool in accordance with the first data storage policy;

defining a second data storage policy for the deduplication pool, the second data storage policy including a maximum reference count for data chunks;

classifying a second data object within the second data storage policy;

dividing the second data object into a plurality of data chunks, each data chunk having reference count data to track a number of references by storage policy thereto; and performing deduplication on the second data object in accordance with the second data storage policy, including for each data chunk of the second data object:

initializing the data chunk reference count data and storing the data chunk in the deduplication pool if a previously stored identical copy of the data chunk does not exist in the deduplication pool, updating the reference count data of and creating a reference to a previously stored identical copy of the data chunk if the previously stored identical copy of the data chunk exists in the deduplication pool and has a reference count less than the second data storage policy maximum reference count, and initializing the data chunk reference count data and storing the data chunk in the deduplication pool if each previously stored identical copy of the data chunk existing within the deduplication pool contains a reference count equal to or greater than the second data storage policy maximum reference count.

11. A method for applying a deduplication strategy to a data object based on a data storage policy, comprising:

performing deduplication on the data object if the data storage policy associated with the data object allows deduplication, including for each data chunk of the data object:

updating reference count data of and creating a reference to a previously stored identical copy of the data chunk if the previously stored identical copy of the data chunk has a reference count less than a maximum reference count of the data storage policy, and storing the data chunk and initializing the reference count data of the data chunk if each previously stored identical copy of the data chunk contains a reference count equal to or greater than the maximum reference count of the data storage policy.

12. A computer program product comprising a computer useable medium having a computer readable program for applying a deduplication strategy to a data object based on a data storage policy, wherein the computer readable program when executed on a computer causes the computer to:

define a plurality of data storage policies for a deduplication pool, each data storage policy containing settings including a maximum reference count for data chunks;

classify the data object within a selected data storage policy;

divide the data object into a plurality of data chunks, each data chunk having reference count data to track a number of references thereto;

store each data chunk of the data object in the deduplication pool if the selected data storage policy does not allow deduplication of the data object; and perform deduplication on the data object if the selected data storage policy allows deduplication of the data object, including for each data chunk of the data object:

initializing the data chunk reference count data and storing the data chunk in the deduplication pool if a previously stored identical copy of the data chunk does not exist in the deduplication pool, updating the reference count data of and creating a pointer to a previously stored identical copy of the data chunk if the previously stored identical copy of the data chunk exists in the deduplication pool and has a reference count less than the selected data storage policy maximum reference count, and initializing the data chunk reference count data and storing the data chunk in the deduplication pool if each previously stored identical copy of the data chunk existing within the deduplication pool contains a reference count equal to or greater than the selected data storage policy maximum reference count.

13. The computer program product as in claim 12, wherein the plurality of data storage policies includes at least three tiered data storage policies, a first data storage policy not allowing data deduplication of data objects, a second data storage policy allowing deduplication of data objects and containing a policy limit for references, and a third data storage policy allowing deduplication of data objects and containing no policy limit for references.

14. The computer program product as in claim 12, wherein the plurality of data storage policies includes a data storage policy that does not allow deduplication of data objects.

15. The computer program product as in claim 12, wherein the plurality of data storage policies includes a data storage policy that allows deduplication of data objects and contains a defined policy limit for references to data chunks.

16. The computer program product as in claim 12, wherein the plurality of data storage policies includes a data storage policy that allows deduplication of data objects and contains no policy limit for references to data chunks.

17. The computer program product as in claim 12, wherein the plurality of data storage policies is arranged in tiers, and data chunks classified according to a data storage policy are permitted to create references to data chunks within the same data storage policy or a higher tiered data storage policy and are not permitted to create references to data chunks within a lower tiered data storage policy.

18. The computer program product as in claim 12, wherein the reference count data includes a plurality of reference counts for tracking the number of references to the data chunk from data chunks classified according to each of the plurality of data storage policies.

19. A system, comprising:

at least one processor; and at least one memory storing instructions operable with the at least one processor for applying a deduplication strategy to a data object based on a data storage policy, the instructions being executed for:

defining a plurality of data storage policies for a deduplication pool, each data storage policy containing settings including a maximum reference count for data chunks;

classifying the data object within a selected data storage policy;

dividing the data object into a plurality of data chunks, each data chunk having a reference count data to track a number of references thereto;

storing each data chunk of the data object in the deduplication pool if the selected data storage policy does not allow deduplication of the data object; and performing deduplication on the data object if the selected data storage policy allows deduplication of the data object, including for each data chunk of the data object:

initializing the data chunk reference count data and storing the data chunk in the deduplication pool if a previously stored identical copy of the data chunk does not exist in the deduplication pool, updating the reference count data of and creating a pointer to a previously stored identical copy of the data chunk if the previously stored identical copy of the data chunk exists in the deduplication pool and has a reference count less than the selected data storage policy maximum reference count, and initializing the data chunk reference count data and storing the data chunk in the deduplication pool if each previously stored identical copy of the data chunk existing within the deduplication pool contains a reference count equal to or greater than the selected data storage policy maximum reference count.

20. The system as in claim 19, wherein the plurality of data storage policies includes at least three tiered data storage policies, a first data storage policy not allowing data deduplication of data objects, a second data storage policy allowing deduplication of data objects and containing a policy limit for references, and a third data storage policy allowing deduplication of data objects and containing no policy limit for references.

21. The system as in claim 19, wherein the plurality of data storage policies includes a data storage policy that does not allow deduplication of data objects.

22. The system as in claim 19, wherein the plurality of data storage policies includes a data storage policy that allows deduplication of data objects and contains a defined policy limit for references to data chunks.

23. The system as in claim 19, wherein the plurality of data storage policies includes a data storage policy that allows deduplication of data objects and contains no policy limit for references to data chunks.

24. The system as in claim 19, wherein the plurality of data storage policies is arranged in tiers, and data chunks classified according to a data storage policy are permitted to create references to data chunks within the same data storage policy or a higher tiered data storage policy and are not permitted to create references to data chunks within a lower tiered data storage policy.

25. The system as in claim 19, wherein the reference count data includes a plurality of reference counts for tracking the number of references to the data chunk from data chunks classified according to each of the plurality of data storage policies.

* * * * *